United States Patent
Tamura et al.

(10) Patent No.: US 6,780,699 B2
(45) Date of Patent: Aug. 24, 2004

(54) SEMICONDUCTOR DEVICE AND METHOD FOR FABRICATING THE SAME

(75) Inventors: Yasuyuki Tamura, Kawasaki (JP); Yusuke Morisaki, Kawasaki (JP); Yoshihiro Sugita, Kawasaki (JP); Kiyoshi Irino, Kawasaki (JP); Takayuki Aoyama, Kawasaki (JP); Chikako Yoshida, Kawasaki (JP); Yoshihiro Sugiyama, Kawasaki (JP); Hitoshi Tanaka, Kawasaki (JP); Kanetake Takasaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/359,250

(22) Filed: Feb. 6, 2003

(65) Prior Publication Data

US 2003/0168697 A1 Sep. 11, 2003

(30) Foreign Application Priority Data

Mar. 7, 2002 (JP) ........................................ 2002-061255

(51) Int. Cl.[7] ............................................. H01L 21/8238
(52) U.S. Cl. ..................... 438/217; 257/310; 257/350; 257/410; 438/200; 438/257
(58) Field of Search ................................ 257/310, 350, 257/410, 334; 438/200, 217, 257, 253, 255

(56) References Cited

U.S. PATENT DOCUMENTS

| 6,077,743 | A | * | 6/2000 | Chen ........................... 438/255 |
| 6,451,641 | B1 | * | 9/2002 | Halliyal et al. ............. 438/200 |
| 2002/0068401 | A1 | * | 6/2002 | Wang et al. ................. 438/253 |
| 2002/0195643 | A1 | * | 12/2002 | Harada ........................ 257/310 |

* cited by examiner

Primary Examiner—David Nelms
Assistant Examiner—Dao H. Nguyen
(74) Attorney, Agent, or Firm—Westerman, Hattori, Daniels & Adrian, LLP

(57) ABSTRACT

A semiconductor device in which the insulation characteristics of an insulating film of multilayer structure including a lower-layer insulating film and a high-dielectric-constant film formed on the lower-layer insulating film are ensured, and a method for fabricating such a semiconductor device. A silicon oxide film or a silicon oxynitride film is formed on a semiconductor substrate as a lower-layer insulating film and part of the lower-layer insulating film is removed. Then a high-dielectric-constant film the dielectric constant of which is higher than that of the lower-layer insulating film is formed on the exposed semiconductor substrate and the lower-layer insulating film. If the lower-layer insulating film is a silicon oxide film, then a metallic compound not including chlorine is used for forming this high-dielectric-constant film. If the lower-layer insulating film is a silicon oxynitride film, then a metallic chloride can be used for forming this high-dielectric-constant film.

20 Claims, 4 Drawing Sheets

SEMICONDUCTOR DEVICE AND METHOD FOR FABRICATING THE SAME

CROSS-REFERENCE TO RELATED APPLICATIONS

This application is based upon and claims priority of Japanese Patent Application No. 2002-061255, filed on Mar. 7, 2002, the contents being incorporated herein by reference.

BACKGROUND OF THE INVENTION (1) Field of the Invention

This invention relates to a semiconductor device and a method for fabricating such a semiconductor device and, more particularly, to a semiconductor device of metal oxide semiconductor (MOS) structure including an insulating film, such as a gate insulator, of two or more different thicknesses and a method for fabricating such a semiconductor device.

(2) Description of the Related Art

Conventionally, silicon oxide films have widely been used as insulating films, such as gate insulators and tunnel insulators, in logic circuits, random access memories (RAMs), erasable programmable read only memories (EPROMs), liquid crystal displays (LCDs), and the like of MOS structure. As these devices become minuter, these insulating films have become thinner. As a result, problems, such as an increase in gate leakage current caused by a direct tunnel current, have arisen. Therefore, in recent years the method of increasing the physical thickness of insulating films by the use of insulating films (high-dielectric-constant films) the dielectric constants of which are higher than that of the conventional silicon oxide films has been proposed.

By the way, voltage applied to elements, such as MOS transistors, is not constant in semiconductor devices in which an LSI circuit is formed. That is to say, some areas operate at high voltage, and others operate at low voltage. Therefore, to decrease a gate leakage current and ensure reliability, MOS transistors in areas where high voltage is applied are thick film transistors in which a thick gate insulator is formed. On the other hand, to improve operation speed and performance, MOS transistors in areas where low voltage is applied are thin film transistors in which a thin gate insulator is formed.

To form a gate insulator of different thicknesses in one semiconductor device, usually the following procedure will be adopted. A silicon substrate is thermally oxidized first to form a thick silicon oxide film. Then a protection film is formed only on an area where a thick film transistor is to be formed, and the silicon oxide film on an area where a thin film transistor is to be formed is removed. After the protection film is removed, the silicon substrate is thermally oxidized again to form a thin silicon oxide film. As a result, a gate insulator of different thicknesses will be formed on the silicon substrate.

To make a gate insulator in a thin film transistor a high-dielectric-constant film, the following procedure, for example, will be adopted. A silicon substrate is thermally oxidized first to form a thick silicon oxide film. Then a protection film is formed on an area where a thick film transistor is to be formed, and the silicon oxide film on an area where a thin film transistor is to be formed is removed. After the protection film is removed, a high-dielectric-constant film is formed by a chemical vapor deposition (CVD) method on the exposed silicon substrate and the silicon oxide film formed by the thermal oxidation. Therefore, a gate insulator in the thin film transistor is of single layer structure of the high-dielectric-constant film and the gate insulator in the thick film transistor is of multilayer structure of the silicon oxide film, being a lower-layer insulating film, and the high-dielectric-constant film formed on it.

However, if a high-dielectric-constant film is formed in a thin film transistor and a multilayer of a silicon oxide film and the high-dielectric-constant film is formed in a thick film transistor, the silicon oxide film formed as a lower-layer insulating film in the thick film transistor may be affected, especially by the influence of chlorine included in gas used as a material for forming the high-dielectric-constant film, resulting in a deterioration in its characteristics as an insulating film.

SUMMARY OF THE INVENTION

The present invention was made under the background circumstances as described above. An object of the present invention is to provide a semiconductor device in which the insulation characteristics of an insulating film including a lower-layer insulating film and a high-dielectric-constant film formed on the lower-layer insulating film are ensured without deteriorating the reliability of the lower-layer insulating film, and a method for fabricating such a semiconductor device.

In order to achieve the above object, a method for fabricating a semiconductor device of MOS structure including an insulating film of two or more different thicknesses. This method comprises the steps of forming a silicon oxide film on a semiconductor substrate, removing part of the silicon oxide film formed, and forming a high-dielectric-constant film the dielectric constant of which is higher than that of the silicon oxide film on the semiconductor substrate which has got exposed as a result of removing the silicon oxide film and on the silicon oxide film by the use of a metallic compound not including chlorine.

Furthermore, in order to achieve the above object, a semiconductor device of MOS structure including two or more kinds of insulating films of different thicknesses is provided. This semiconductor device includes a high-dielectric-constant film which is formed by the use of a metallic compound not including chlorine on a semiconductor substrate and a silicon oxide film formed on part of the semiconductor substrate and the dielectric constant of which is higher than that of the silicon oxide film.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

An overview of the present invention will be given first with reference to the drawings.

Figure 1A:
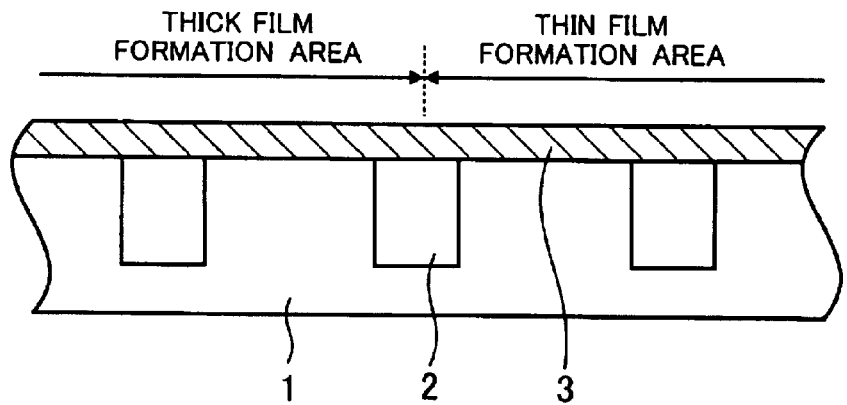
FIGS. 1(A) through 1(C) are views for describing processes for forming an insulating film of different thicknesses on a semiconductor substrate, FIG. 1(A) being a view for describing a process for forming a lower-layer insulating film, FIG. 1(B) being a view for describing a process for removing the lower-layer insulating film, and FIG. 1(C) being a view for describing a process for forming a high-dielectric-constant film.
Figure 1B:
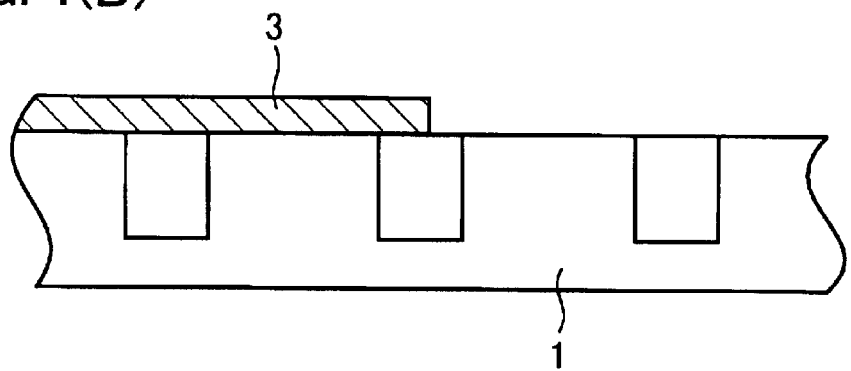
Figure 1C:
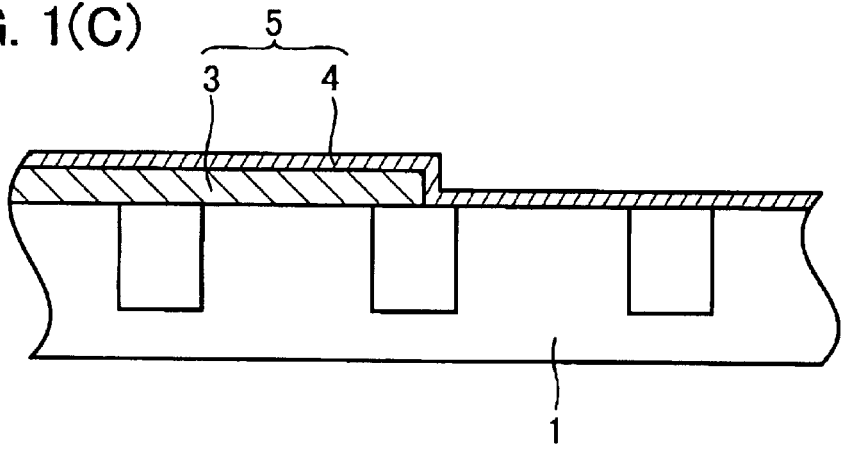

FIGS. 1(A) through 1(C) are views for describing processes for forming an insulating film of different thicknesses on a semiconductor substrate. FIG. 1(A) is a view for describing a process for forming a lower-layer insulating film. FIG. 1(B) is a view for describing a process for removing the lower-layer insulating film. FIG. 1(C) is a view for describing a process for forming a high-dielectric-constant film.

As shown in FIG. 1(A), to form an insulating film of different thicknesses on a semiconductor substrate 1, a lower-layer insulating film 3 is formed first on the semiconductor substrate 1 in which an isolation area 2 not only for electrically isolating an area (thick film formation area) where a thick insulating film for a thick film transistor is to be formed from an area (thin film formation area) where a thin insulating film for a thin film transistor is to be formed but also for electrically isolating an element to be formed in one area from an element to be formed in the other area has been formed. The lower-layer insulating film 3 is a silicon oxide film or a silicon oxynitride film.

Then only the portion formed in the thin film formation area of the lower-layer insulating film 3 formed on the semiconductor substrate 1 is removed as shown in FIG. 1(B). This removal can be performed by wet etching with, for example, hydrofluoric acid. As a result, the lower-layer insulating film 3 formed in the thick film formation area remains intact on the semiconductor substrate 1 and the surface of the semiconductor substrate 1 in the thin film formation area gets exposed.

As shown in FIG. 1(C), after that a high-dielectric-constant film 4 is formed in the thin film formation area and thick film formation area on the semiconductor substrate 1 by, for example, a CVD method.

If the lower-layer insulating film 3 is a silicon oxide film, a metallic compound which does not include chlorine as a component is used as a material for forming the high-dielectric-constant film 4. For example, a metal complex, such as tetrakisdiethylaminohafnium (TDEAH), will be used. The high-dielectric-constant film 4 is formed as a metallic oxide by a CVD method under which not only such a metallic compound not including chlorine as a material but also oxygen gas are used. Therefore, a metallic compound not including chlorine which will be used as a material includes a metal, such as the above hafnium (Hf), which shows a high dielectric constant in the case of forming an oxide.

Aluminum (Al), zirconium (Zr), yttrium (Y), thorium (Th), praseodymium (Pr), neodymium (Nd), lithium (Li), beryllium (Be), magnesium (Mg), scandium (Sc), strontium (Sr), lanthanum (La), or the like can also be used as such a metal. A film of an oxide including one of these metals shows a dielectric constant higher than that of a silicon oxide film or a silicon oxynitride film. A mixture of two or more kinds of metallic compounds each not including chlorine but including one of these metals can be used. A metallic compound not including chlorine but including two or more of these metals as components may also be used.

By forming the high-dielectric-constant film 4 in this way, the degradation, and therefore a deterioration of the insulation characteristics, of the lower-layer insulating film 3 which have occurred in the case of using the conventional material can be prevented.

If the lower-layer insulating film 3 is a silicon oxynitride film, a metallic compound, such as hafnium chloride, including chlorine as a component can be used as a material for forming the high-dielectric-constant film 4. The reason for this is that the lower-layer insulating film 3, being a silicon oxynitride film, prevents the degradation of the lower-layer insulating film 3 caused by chlorine included in a material. Therefore, even if a material includes chlorine as a component, a deterioration of the insulation characteristics of an insulating film 5 can be prevented.

As a result of forming the high-dielectric-constant film 4 described above, a single layer of the high-dielectric-constant film 4 is formed in the thin film formation area and the high-dielectric-constant film 4 is formed on the lower-layer insulating film 3 in the thick film formation area. If the lower-layer insulating film 3 is a silicon oxide film, then a metallic compound which does not include chlorine as a component is used as a material for forming the high-dielectric-constant film 4. If the lower-layer insulating film 3 is a silicon oxynitride film, then a metallic chloride can be used as a material for forming the high-dielectric-constant film 4. As a result, multilayer structure can be realized without deteriorating the reliability of the lower-layer insulating film 3 and a semiconductor device with the insulating film 5 of different thicknesses which shows high performance and high reliability can be fabricated.

Embodiments of the present invention will now be described in detail with reference to the drawings.

A first embodiment will be described first.

Figure 2A:
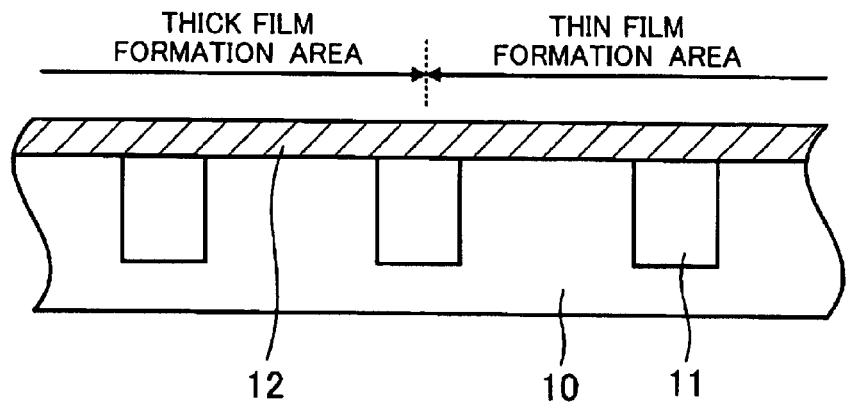
FIGS. 2(A) through 2(C) are views for describing processes for forming an insulating film according to a first embodiment of the present invention, FIG. 2(A) being a view for describing a process for forming a lower-layer insulating film, FIG. 2(B) being a view for describing a process for removing the lower-layer insulating film, and FIG. 2(C) being a view for describing a process for forming a high-dielectric-constant film.
Figure 2B:
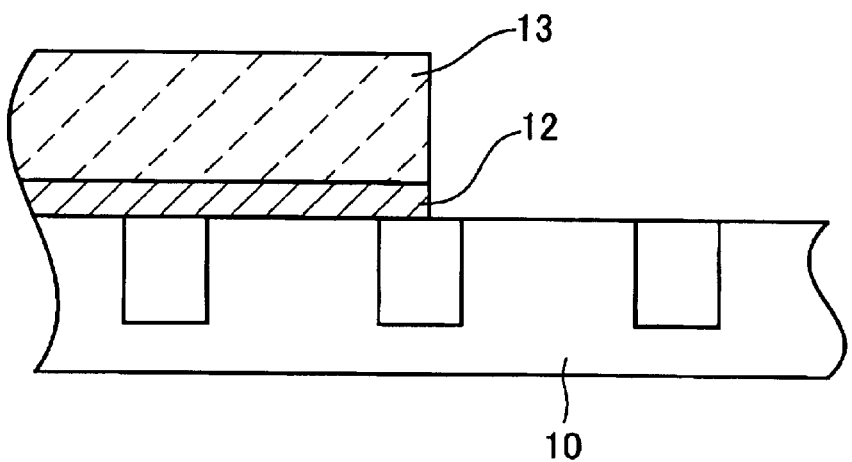
Figure 2C:
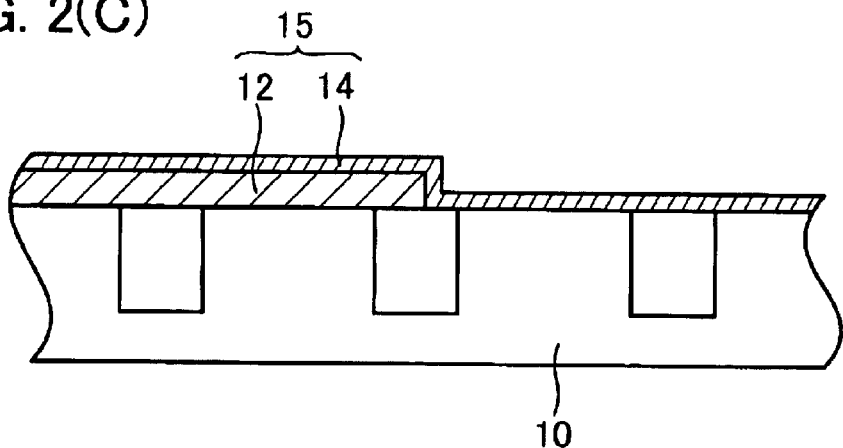

FIGS. 2(A) through 2(C) are views for describing processes for forming an insulating film according to a first embodiment of the present invention. FIG. 2(A) is a view for describing a process for forming a lower-layer insulating film. FIG. 2(B) is a view for describing a process for removing the lower-layer insulating film. FIG. 2(C) is a view for describing a process for forming a high-dielectric-constant film.

To form an insulating film of different thicknesses on a silicon substrate 10, the silicon substrate 10 in which an isolation area 11 not only for electrically isolating a thick film formation area but also for electrically isolating an element to be formed in one area from an element to be formed in the other area from a thin film formation area has been formed is cleaned first with hydrofluoric acid or the like so that part of the surface of the silicon substrate 10 will get exposed. Then thermal oxidation is performed on the silicon substrate 10 in a diffusion furnace by the use of oxygen ($O_2$) gas. By doing so, as shown in FIG. 2(A), a silicon oxide film 12 of a thickness of 6 nanometers is formed on the silicon substrate 10 as a lower-layer insulating film.

After a protection film 13 is formed on the entire surface of the silicon oxide film 12 formed on the silicon substrate 10, exposure and development treatment is performed. As shown in FIG. 2(B), a portion formed in the thin film formation area of the protection film 13 formed on the entire surface of the silicon oxide film 12 is removed for patterning. Then wet etching is performed with hydrofluoric acid or the like to remove a portion formed in the thin film formation area of the silicon oxide film 12 formed on the silicon substrate 10. As a result, the silicon oxide film 12 formed in the thick film formation area remains intact on the silicon substrate 10 and the surface of the silicon substrate 10 in the thin film formation area gets exposed.

After the protection film 13 is removed and the silicon substrate 10 is cleaned, the silicon substrate 10 is transported into the vacuum chamber of a CVD system. The transported silicon substrate 10 is heated to 500° C. in the vacuum chamber. As shown in FIG. 2(C), a hafnium oxide ($HfO_2$) film 14 of a thickness of 3 nanometers is formed on the silicon substrate 10 and silicon oxide film 12 by a CVD method under which TDEAH as a metallic compound not including chlorine, together with oxygen gas, is introduced into the vacuum chamber.

By forming the hafnium oxide film 14 in this way, a single layer of the hafnium oxide film 14 is formed in the thin film formation area as a high-dielectric-constant film and the hafnium oxide film 14 is formed on the silicon oxide film 12 in the thick film formation area. TDEAH is used as a material for forming the hafnium oxide film 14. Therefore, multilayer structure can be formed without deteriorating the reliability of the silicon oxide film 12, being a lower-layer insulating film, and an insulating film 15 of different thicknesses can be formed on the silicon substrate 10.

Now, a second embodiment of the present invention will be described.

Figure 3A:
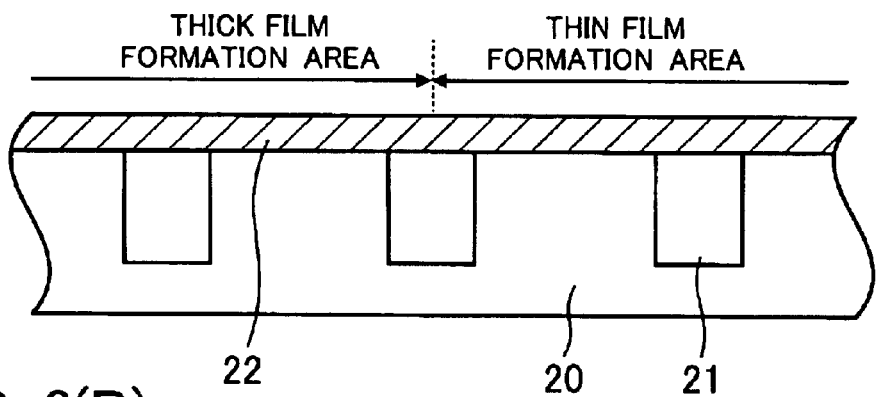
FIGS. 3(A) through 3(D) are views for describing processes for forming an insulating film according to a second embodiment of the present invention, FIG. 3(A) being a view for describing a process for forming a lower-layer insulating film, FIG. 3(B) being a view for describing a process for nitriding the lower-layer insulating film, FIG. 3(C) being a view for describing a process for removing the lower-layer insulating film, and FIG. 3(D) being a view for describing a process for forming a high-dielectric-constant film.
Figure 3B:
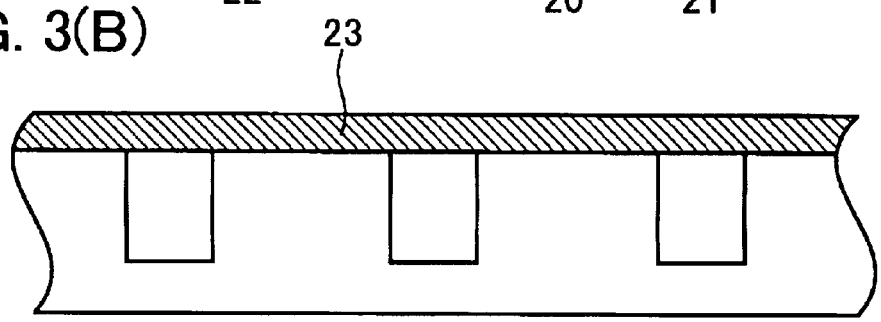
Figure 3C:
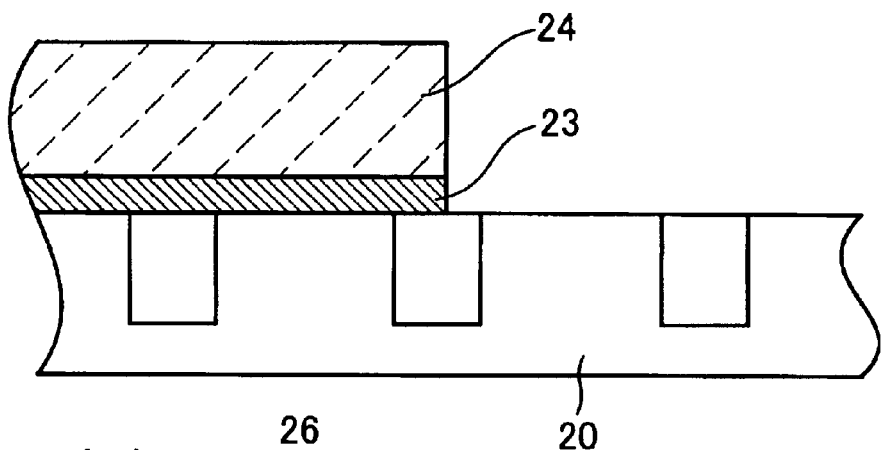
Figure 3D:
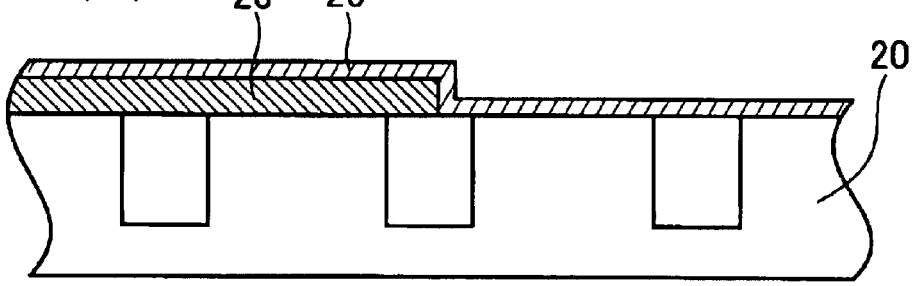

FIGS. 3(A) through 3(D) are views for describing processes for forming an insulating film according to a second embodiment of the present invention. FIG. 3(A) is a view for describing a process for forming a lower-layer insulating film. FIG. 3(B) is a view for describing a process for nitriding the lower-layer insulating film. FIG. 3(C) is a view for describing a process for removing the lower-layer insulating film. FIG. 3(D) is a view for describing a process for forming a high-dielectric-constant film.

In the second embodiment, a silicon substrate 20 in which an isolation area 21 for electrically isolating a thick film formation area from a thin film formation area has been formed is cleaned first with hydrofluoric acid or the like so that part of the surface of the silicon substrate 20 will get exposed. Then thermal oxidation is performed on the silicon substrate 20 in a diffusion furnace by the use of oxygen gas. By doing so, as shown in FIG. 3(A), a silicon oxide film 22 of a thickness of 5.5 nanometers is formed on the silicon substrate 20 as a lower-layer insulating film.

Then gas introduced into the diffusion furnace is switched over from oxygen gas to nitric oxide (NO) and, as shown in FIG. 3(B), a silicon oxynitride film 23 of a total thickness of 6 nanometers is formed.

Next, after a protection film 24 is formed on the entire surface of the silicon oxynitride film 23 formed on the silicon substrate 20, exposure and development treatment is performed to remove the protection film 24 in the thin film formation area. Then wet etching is performed with hydrofluoric acid or the like. By doing so, as shown in FIG. 3(C), a portion formed in the thin film formation area of the silicon oxynitride film 23 formed on the silicon substrate 20 is removed. As a result, the silicon oxynitride film 23 formed in the thick film formation area remains intact on the silicon substrate 20 and the surface of the silicon substrate 20 in the thin film formation area gets exposed.

After the protection film 24 is removed and the silicon substrate 20 is cleaned, the silicon substrate 20 is transported into the vacuum chamber of a CVD system. The transported silicon substrate 20 is heated to 400° C. in the vacuum chamber. As shown in FIG. 3(D), a hafnium oxide film 25 of a thickness of 3 nanometers is formed on the silicon substrate 20 and silicon oxynitride film 23 by an atomic layer chemical vapor deposition (ALCVD) method under which hafnium chloride and water vapor are introduced alternately into the vacuum chamber.

By forming the hafnium oxide film 25 in this way, a single layer of the hafnium oxide film 25 is formed in the thin film formation area as a high-dielectric-constant film and the hafnium oxide film 25 is formed on the silicon oxynitride film 23 in the thick film formation area. An insulating film formed beneath the hafnium oxide film 25 is the silicon oxynitride film 23. Therefore, even if chlorine is included in a material for forming the hafnium oxide film 25, the degradation of the silicon oxynitride film 23 is prevented and an insulating film 26 of different thicknesses can be formed on the silicon substrate 20 without deteriorating its insulation characteristics.

As described above, if a lower-layer insulating film is the silicon oxide film 12 shown in FIGS. 2(A) through 2(C), then a metallic compound not including chlorine is used as a material for forming a high-dielectric-constant film. On the other hand, if a lower-layer insulating film is the silicon oxynitride film 23 shown in FIGS. 3(B) through 3(D), then a metallic chloride is used as a material for forming a high-dielectric-constant film. By doing so, a high-dielectric-constant film can be formed on a lower-layer insulating film without deteriorating the reliability of the lower-layer insulating film.

Figure 4:
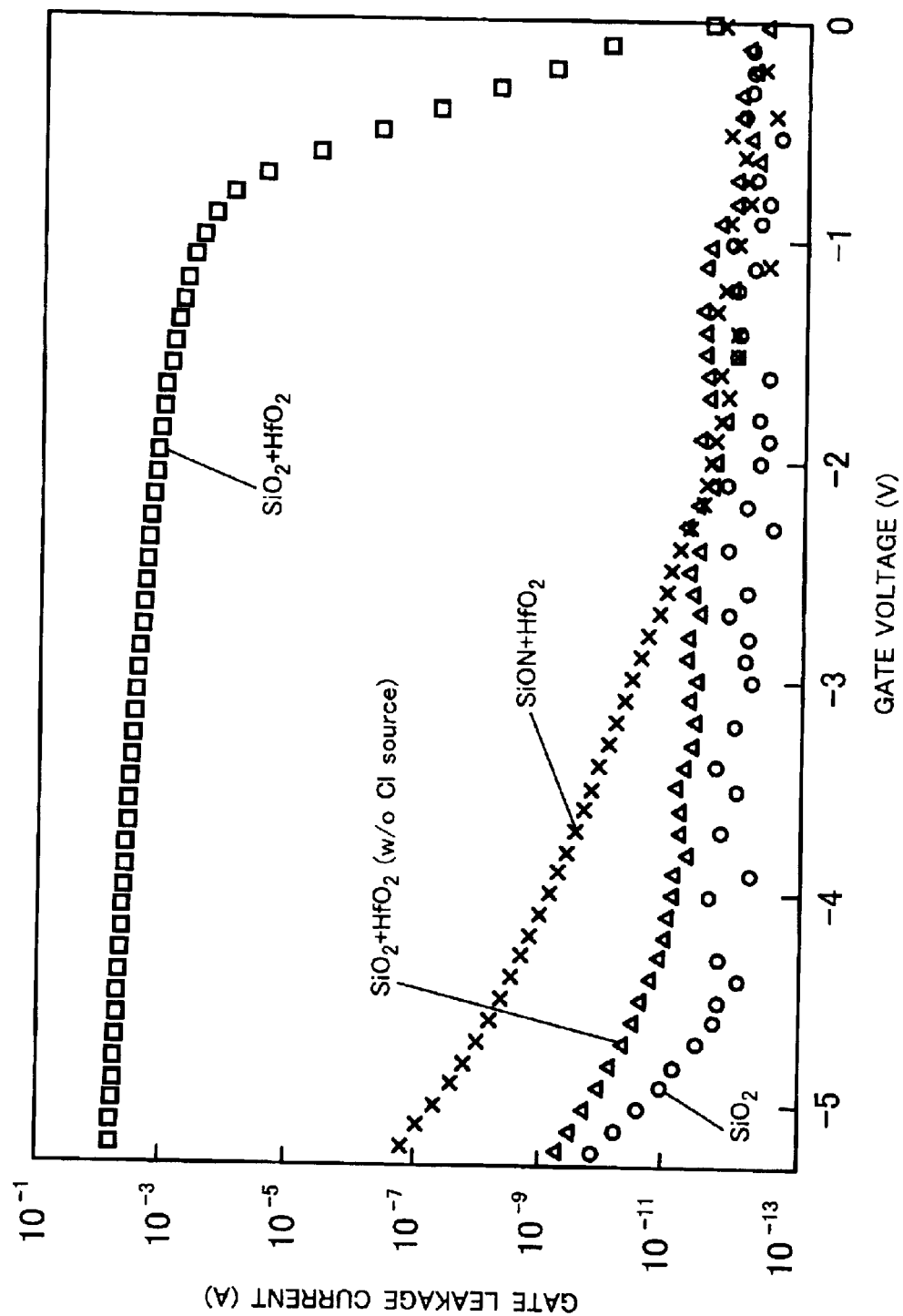
FIG. 4 is a view showing relations between gate voltage and a gate leakage current.

FIG. 4 is a view showing relations between gate voltage and a gate leakage current. Horizontal and vertical axes in FIG. 4 indicate the values of gate voltage (V) and a gate leakage current (A) respectively. n-channel MOS diodes (nMOS diodes) with an area of $4.096 \times 10^{-3}$ ($cm^2$) on which insulating films are formed by the methods according to the above first and second embodiments will be used for measuring these values. FIG. 4 shows the results of measurement obtained in the case of forming an insulating film by the method according to the first embodiment (shown by "$SiO_2+HfO_2$ (w/o Cl source)") and in the case of forming an insulating film by the method according to the second embodiment (shown by "$SiON+HfO_2$"). FIG. 4 also shows the results of measurement obtained in the case of forming only a silicon oxide film as an insulating film (shown by "$SiO_2$") and in the case of forming a hafnium oxide film on a silicon oxide film by a conventional method (shown by "$SiO_2+HfO_2$").

As shown in FIG. 4, if only a silicon oxide film is used as an insulating film, the value of a gate leakage current remains very small when gate voltage is decreased from 0 V to about −4.5 V.

If a hafnium oxide film is formed on a silicon oxide film by a conventional method, the value of a gate leakage current becomes great as soon as gate voltage is decreased from 0 V. The reason for this is that insulation characteristics deteriorate due to the degradation of the silicon oxide film, being a lower-layer insulating film, which occurred at the time of an insulating film being formed.

On the other hand, if an insulating film is formed by the method according to the first embodiment, the value of a gate leakage current obtained when gate voltage is decreased from 0 V is much the same as that of a gate leakage current obtained where only a silicon oxide film is used as an insulating film. This means that the method according to the first embodiment can prevent insulation characteristics from deteriorating.

Furthermore, if an insulating film is formed by the method according to the second embodiment, the value of a gate leakage current remains small while gate voltage is between 0 and about −2 V. When gate voltage is decreased further, the value of a gate leakage current tends to become greater. Therefore, the method according to the second embodiment can also prevent insulation characteristics from deteriorating.

Judging from these results, a metallic compound not including chlorine can be used as a material for forming an upper-layer high-dielectric-constant film in the case of a lower-layer insulating film being a silicon oxide film and a metallic chloride can be used as a material for forming an upper-layer high-dielectric-constant film in the case of a lower-layer insulating film being a silicon oxynitride film. By doing so, an insulating film of multilayer structure including a lower-layer insulating film the degradation of which is prevented and a high-dielectric-constant film can be formed. As a result, a semiconductor device with an insulating film of different thicknesses which shows high performance and high reliability can be fabricated.

A case where an insulating film of two thicknesses is formed in one semiconductor device has been described. However, the present invention is not limited to such a case and is also applicable to cases where an insulating film of three or more thicknesses is formed in one semiconductor device.

As has been described in the foregoing, in the present invention a metallic compound not including chlorine is used for forming an insulating film by forming a high-dielectric-constant film on a silicon oxide film. Moreover, an insulating film is formed by forming a high-dielectric-constant film on a silicon oxynitride film. By doing so, an insulating film of multilayer structure including a silicon oxide film or silicon oxynitride film, being a lower-layer insulating film, the degradation of which is prevented and a high-dielectric-constant film can be formed. Therefore, a semiconductor device with an insulating film of different thicknesses which shows high performance and high reliability can be fabricated.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A method for fabricating a semiconductor device of MOS structure including an insulating film of two or more different thicknesses, the method comprising:
   forming a silicon oxide film on a semiconductor substrate;
   removing part of the silicon oxide film formed; and
   forming a high-dielectric-constant film, the dielectric constant of which is higher than the dielectric constant of the silicon oxide film, on the semiconductor substrate that was exposed as a result of removing the silicon oxide film, and on the silicon oxide film by use of a metallic compound not including chlorine, one thickness of the insulating film being a thickness of the high-dielectric-constant film on the semiconductor substrate, and a second thickness of the insulating film being a thickness of the high-dielectric-constant film and the silicon oxide film.

2. The method for fabricating a semiconductor device according to claim 1, wherein the metallic compound not including chlorine but including at least one metal of hafnium, aluminum, zirconium, yttrium, thorium, praseodymium, neodymium, lithium, beryllium, magnesium, scandium, strontium, and lanthanum as a component is used when the high-dielectric-constant film is formed.

3. The method for fabricating a semiconductor device according to claim 1, wherein tetrakisdiethylaminohafnium is used as the metallic compound not including chlorine when the high-dielectric-constant film is formed.

4. The method for fabricating a semiconductor device according to claim 1, wherein a metallic oxide is used for forming the high-dielectric-constant film when the high-dielectric-constant film is formed.

5. The method for fabricating a semiconductor device according to claim 1, wherein a hafnium oxide film is formed as the high-dielectric-constant film using tetrakisdiethylaminohafnium and oxygen gas.

6. A method for fabricating a semiconductor device of MOS structure including an insulating film of two or more different thicknesses, the method comprising:
   forming a silicon oxynitride film on a semiconductor substrate;
   removing part of the silicon oxynitride film formed; and
   forming a high-dielectric-constant film, the dielectric constant of which is higher than the dielectric constant of the silicon oxynitride film, on the semiconductor substrate that was exposed as a result of removing the silicon oxynitride film and on the silicon oxynitride film, one thickness of the insulating film being a thickness of the high-dielectric-constant film on the semiconductor substrate, and a second thickness of the insulating film being a thickness of the high-dielectric-constant film and the silicon oxynitride film.

7. The method for fabricating a semiconductor device according to claim 6, wherein a metallic chloride including at least one metal of hafnium, aluminum, zirconium, yttrium, thorium, praseodymium, neodymium, lithium, beryllium, magnesium, scandium, strontium, and lanthanum as a component is used for forming the high-dielectric-constant.

8. The method for fabricating a semiconductor device according to claim 6, wherein a metallic oxide is used for forming the high-dielectric-constant film.

9. The method for fabricating a semiconductor device according to claim 6, wherein when the silicon oxynitride film is formed on the semiconductor substrate, a silicon oxide film is formed on the semiconductor substrate by the use of oxygen gas, then the silicon oxide film is nitrided by switching the oxygen gas over to nitric oxide to form the silicon oxynitride film.

10. The method for fabricating a semiconductor device according to claim 6, wherein a hafnium oxide film is formed as the high-dielectric-constant film using hafnium chloride and water vapor by turns.

11. A semiconductor device of MOS structure comprising an insulating film of two or more different thicknesses, the insulating film including a high-dielectric-constant film formed, by use of a metallic compound not including chlorine, on a semiconductor substrate and on a silicon oxide film disposed on part of the semiconductor substrate, wherein the dielectric constant of the high-dielectric-constant film is higher than the dielectric constant of the silicon oxide film, and wherein one thickness of the insulating film is a thickness of the high-dielectric-constant film on the semiconductor substrate and a second thickness of the insulating film is a thickness of the high-dielectric-constant film and the silicon oxide film.

12. The semiconductor device according to claim 11, wherein the metallic compound not including chlorine includes at least one metal of hafnium, aluminum, zirconium, yttrium, thorium, praseodymium, neodymium, lithium, beryllium, magnesium, scandium, strontium, and lanthanum as a component.

13. The semiconductor device according to claim 11, wherein the metallic compound not including chlorine is tetrakisdiethylaminohafnium.

14. The semiconductor device according to claim 11, wherein the high-dielectric-constant film is a metallic oxide formed by the use of a metallic compound not including chlorine.

15. A semiconductor device of MOS structure comprising an insulating film of two or more different thicknesses, the insulating film including a high-dielectric-constant film which is formed by use of a metallic chloride on a semiconductor substrate and on a silicon oxynitride film disposed on part of the semiconductor substrates, wherein the dielectric constant of the high-dielectric-constant film is higher than the dielectric constant of the silicon oxynitride film, and wherein one thickness of the insulating film is a thickness of the high-dielectric-constant film on the semiconductor substrate and a second thickness of the insulating film is a thickness of the high-dielectric-constant film and the silicon oxynitride film.

16. The semiconductor device according to claim 15, wherein the metallic chloride includes at least one metal of hafnium, aluminum, zirconium, yttrium, thorium, praseodymium, neodymium, lithium, beryllium, magnesium, scandium, strontium, and lanthanum as a component.

17. The semiconductor device according to claim 15, wherein the high-dielectric-constant film is a metallic oxide formed by the use of a metallic chloride.

18. A method for fabricating a semiconductor device of MOS structure including an insulating film of two or more different thicknesses in a semiconductor substrate having a thick film formation area and a thin film formation area, the method comprising:

forming a silicon oxide film on the semiconductor substrate;

removing the silicon oxide film formed from the thin film formation area to leave the silicon oxide film on the thick film formation area as a lower-layer insulating film;

forming a high-dielectric-constant film, the dielectric constant of which is higher than the dielectric constant of the silicon oxide film, in the thick film formation area and the thin film formation area by using a metallic compound not including chlorine, without deteriorating the lower-layer insulating film.

19. A semiconductor device of MOS structure comprising:

an insulating film of two or more different thicknesses in a semiconductor substrate having a thick film formation area and a thin film formation area; and a high-dielectric-constant film formed with a metallic compound not including chlorine on the thin film formation area and on a silicon oxide film formed on the thick film formation area as a lower-layer insulating film, a dielectric constant of the high-dielectric-constant film being higher than a dielectric constant of the silicon oxide film.

20. A semiconductor device of MOS structure comprising:

an insulating film of two or more different thicknesses in a semiconductor substrate having a thick film formation area and a thin film formation area; and a high-dielectric-constant film formed with a metallic chloride on the thin film formation area and on a silicon oxynitride film formed on the thick film formation area as a lower-layer insulating film, a dielectric constant of the high-dielectric constant film being higher than a dielectric constant of the silicon oxynitride film.

* * * * *